(12) United States Patent
Kurita (10) Patent No.: US 7,812,446 B2
(45) Date of Patent: Oct. 12, 2010

(54) SEMICONDUCTOR DEVICE

(75) Inventor: Yoichiro Kurita, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 239 days.

(21) Appl. No.: 12/107,795

(22) Filed: Apr. 23, 2008

(65) Prior Publication Data

US 2008/0265390 A1 Oct. 30, 2008

(30) Foreign Application Priority Data

Apr. 24, 2007 (JP) ............................. 2007-113801

(51) Int. Cl.
*H01L 23/34* (2006.01)
(52) U.S. Cl. .............................. 257/725; 257/E23.151; 257/686; 257/723; 257/781; 438/107; 438/109
(58) Field of Classification Search .......... 257/E23.141, 257/E23.151, 685, 686, 723–725, 773–778, 257/781, 782, 785, 786; 438/107, 109, 110
See application file for complete search history.

(56) References Cited

U.S. PATENT DOCUMENTS

| 6,294,407 | B1 * | 9/2001 | Jacobs | 438/118 |
| 6,407,929 | B1 * | 6/2002 | Hale et al. | 361/763 |
| 6,503,765 | B1 * | 1/2003 | Chao et al. | 438/14 |
| 6,594,153 | B1 * | 7/2003 | Zu et al. | 361/792 |
| 6,870,252 | B2 * | 3/2005 | Novak et al. | 257/691 |
| 7,132,743 | B2 * | 11/2006 | Palanduz | 257/703 |
| 7,166,916 | B2 * | 1/2007 | Akamatsu et al. | 257/724 |
| 7,193,311 | B2 * | 3/2007 | Ogawa et al. | 257/687 |
| 7,304,369 | B2 * | 12/2007 | Barnett | 257/659 |
| 7,566,960 | B1 * | 7/2009 | Conn | 257/686 |
| 7,586,188 | B2 * | 9/2009 | Chang | 257/703 |
| 7,592,689 | B2 * | 9/2009 | Brunnbauer | 257/685 |
| 2002/0159242 | A1 * | 10/2002 | Nakatani et al. | 361/760 |
| 2008/0079163 | A1 * | 4/2008 | Kurita et al. | 257/759 |
| 2008/0105987 | A1 * | 5/2008 | Hosomi | 257/784 |
| 2008/0128915 | A1 * | 6/2008 | Ueda et al. | 257/777 |
| 2009/0057886 | A1 * | 3/2009 | Nakayama | 257/734 |
| 2009/0057919 | A1 * | 3/2009 | Lin et al. | 257/777 |

FOREIGN PATENT DOCUMENTS

| JP | 2001-024089 | 1/2001 |
| JP | 2001-024150 | 1/2001 |
| JP | 2003-060153 | 2/2003 |
| JP | 2006-019433 | 1/2006 |

OTHER PUBLICATIONS

"Tech-On!", Techon, http://techon.nikkeibp.co.jp, Article, News, Sep. 27, 2006, 121563.
"Cnet", http://Japan.Cnet.com, Cnet 2006 News, Sep. 29, 2006.

* cited by examiner

*Primary Examiner*—Chris Chu
(74) *Attorney, Agent, or Firm*—Young & Thompson (57) ABSTRACT

A method of manufacturing a semiconductor device including a PMOS transistor and a NMOS transistor is described. The method facilitates obtaining a FUSI phase of a suitable composition for the NMOS transistor and the PMOS transistor respectively, with fewer mask layers and through a fewer number of manufacturing steps.

17 Claims, 8 Drawing Sheets

SEMICONDUCTOR DEVICE

This application is based on Japanese patent application No. 2007-113801, the content of which is incorporated hereinto by reference.

BACKGROUND

1. Technical Field

The present invention relates to a semiconductor device.

2. Related Art

Figure 7:
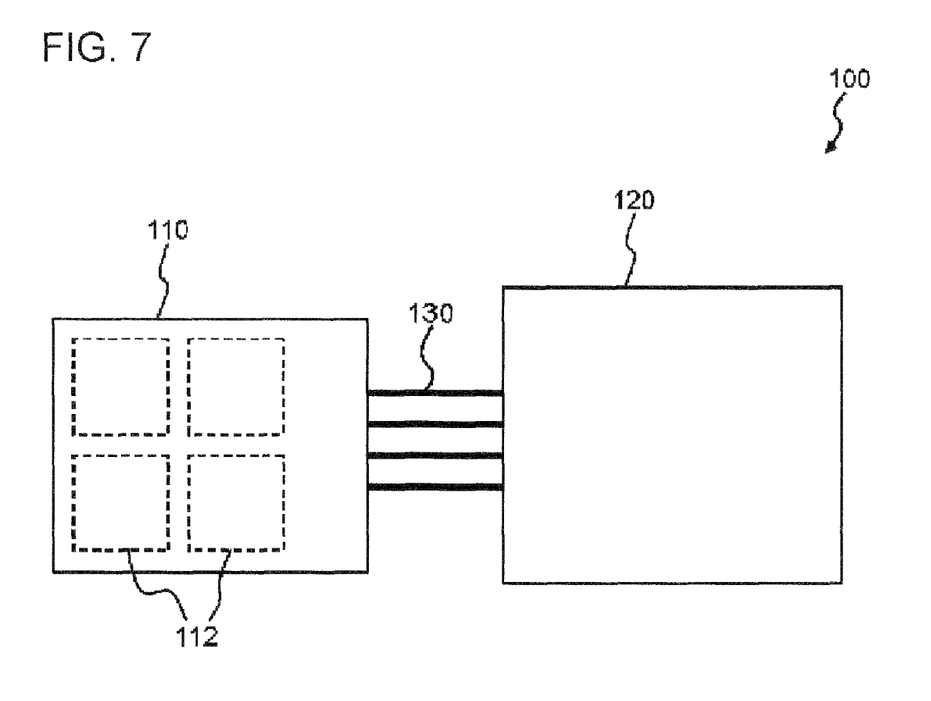
FIG. 7 is a block diagram showing a conventional semiconductor device.

FIG. 7 is a block diagram showing a semiconductor device. In the semiconductor device 100, a processor chip 110 and a memory chip 120 are connected to each other through a communication path 130 provided in a substrate or a system board of a semiconductor package. The processor chip 110 is what is known as a multicore processor, which includes a plurality of processor cores 112.

The semiconductor device 100 thus including the multicore processor (processor chip 110) is expected to exhibit excellent performance through operating the plurality of processor cores 112 in parallel.

In the semiconductor device 100, however, the plurality of processor cores 112 receives and outputs a signal through an I/O region provided in common on the processor chip 110. Accordingly, despite the parallel operation of the processor cores 112, the communication with the memory chip 120 is not efficiently performed, which spoils the high operation speed which would otherwise be achieved, thereby restricting the performance of the semiconductor device 100. Moreover, the communication between the processor chip 110 and the memory chip 120 is made through the communication path 130 provided in the substrate or the system board of the semiconductor package, in other words, through a long distance. Such configuration may incur degradation in performance of the semiconductor device 100, originating from a delay in communication.

Figure 8:
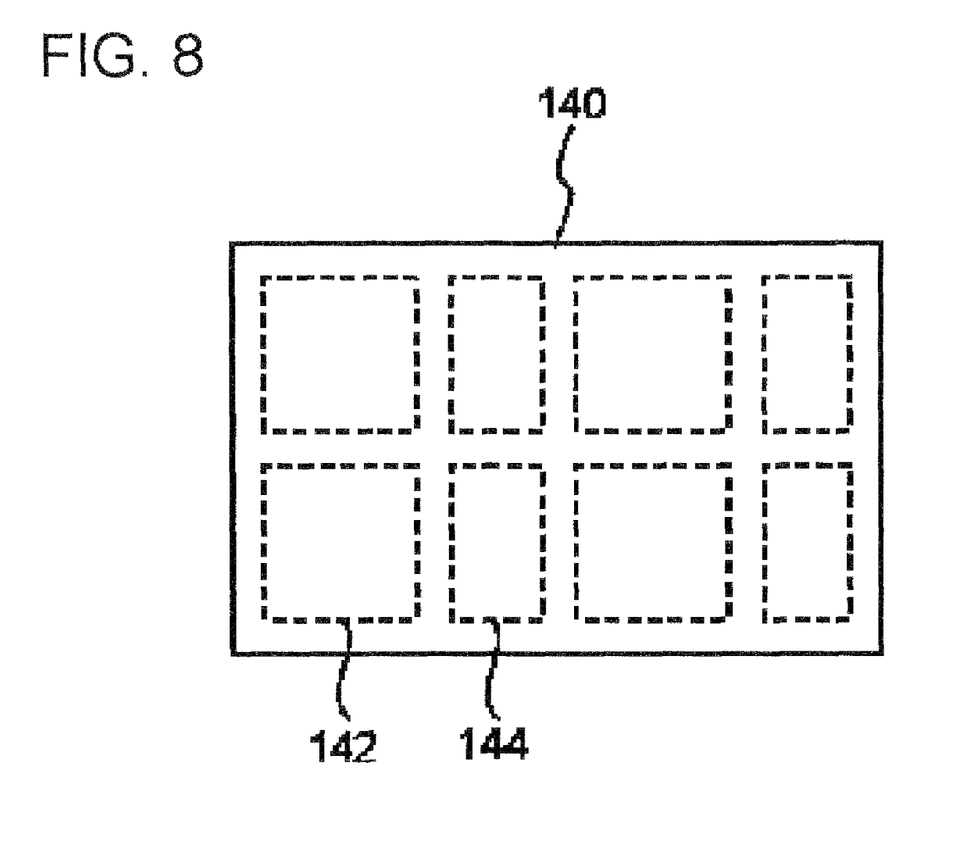
FIG. 8 is a schematic diagram for explaining a drawback of the conventional technique.

A solution of such drawback of the delay in communication would be providing a memory region 144 in a semiconductor chip 140 including a processor core 142, as shown in FIG. 8, to thereby improve the communication speed between the processor core 142 and the memory region 144. Such structure, however, inevitably leads to an increase in area of the semiconductor chip 140, in proportion to the footprint of the memory region 144. Besides, in this case a sufficient capacity of the memory region 144 may not always be secured, because increasing the capacity of the memory region 144 incurs a further increase in area of the semiconductor chip 140. Besides, providing the plurality of processor cores offers no solution of the problem that the high operation speed, expected from operating the plurality of processor cores in parallel, cannot be achieved.

Non-patented document 1 cited below suggests a structure in which a memory chip including a via penetrating through a silicon substrate is stacked on a processor chip including a plurality of processor cores, by means of bumps provided therebetween. Such structure allows allocating a large-capacity memory to each processor core. In this case, the communication between the processor core and the memory chip is performed by the intermediation of the via penetrating through the silicon substrate. In other words, the communication between the processor core and the memory is made by the intermediation of the through-silicon via formed in the memory chip. On the sidewall of the through-silicon via formed in the memory chip, an insulating layer is provided for insulation from the silicon. Accordingly, the through-silicon via formed in the memory chip (in the silicon substrate) has large parasitic capacitance, which disturbs increasing the speed of the communication. Also, in order to increase the number of communication paths from the processor, the number of through-silicon vias in the memory chip has to be increased. Further, devices such as transistors cannot be formed in a region where the through-silicon via is provided, which resultantly leads to an increase in cost of the memory chip, per unit capacity.

Reference to the foregoing technique can be found, for example, in JP-A No. 2006-19433, JP-A No. 2003-60153, JP-A No. 2001-24150, and JP-A No. 2001-24089, and also in the websites cited below.

[Patented document 1] JP-A No. 2006-19433
[Patented document 2] JP-A No. 2003-60153
[Patented document 3] JP-A No. 2001-24150
[Patented document 4] JP-A No. 2001-24089
[Non-patented document 1]
http://techon.nikkeibp.co.jp/article/NEWS/20060927/121563/
[Non-patented document 2]
http://japan.cnet.com/news/ent/story/0,2000056022,20254608,00.htm As stated above, in semiconductor devices including a processor chip having a plurality of processor cores, sufficiently high communication speed between each of the processor cores of the processor chip and a memory chip has not been achieved, despite that parallel operation of the processor cores is expected to achieve a significant increase in processing speed.

This is also the case with semiconductor chips including a plurality of functional blocks. To be more detailed, in the semiconductor chip including the plurality of functional blocks, an I/O region has to be shared among the functional blocks, which leads to such drawbacks as degradation in efficiency of communication with another semiconductor chip, delay in communication originating from a long communication distance between each functional block and another semiconductor chip, and delay in communication originating from parasitic capacitance in a communication path, such as the through-silicon via, for another semiconductor chip.

In view of the foregoing problems, an object of the present invention is to provide a semiconductor device including a semiconductor chip having a plurality of functional blocks, capable of increasing communication speed between each of the functional blocks and another semiconductor chip.

SUMMARY

In one embodiment, there is provided a semiconductor device comprising a first semiconductor chip including a plurality of first functional blocks each serving as a unit circuit that performs a specific function, a plurality of first communication paths respectively connected to each of the plurality of first functional blocks, to be used for inputting and outputting to and from each of the plurality of first functional blocks, and an interposer that supports the first semiconductor chip, wherein the first communication paths are provided so as to penetrate through the interposer in a thicknesswise direction thereof.

In the semiconductor device thus constructed, each of the plurality of first functional blocks of the first semiconductor chip is connected to the communication path (first communication path). The communication path is provided so as to penetrate through the interposer supporting the first semiconductor chip, thicknesswise of the interposer. Such structure allows each of the functional blocks to perform communication in parallel, thereby increasing the communication speed. Also, providing the communication path (first communication path) so as to penetrate the interposer thicknesswise thereof shortens the communication distance to another chip or an external terminal, thereby increasing the communication speed.

In the foregoing semiconductor device, the first semiconductor chip may include a communication path with the plurality of first functional blocks.

In the foregoing semiconductor device, the first functional block may be a processor core, and the first semiconductor chip may be a processor chip that includes a plurality of processor cores.

The foregoing semiconductor device may further comprise a second semiconductor chip on a second surface of the interposer opposite to a first surface on which the first semiconductor chip is provided, and the first and the second semiconductor chip may be connected to each other through the first communication path.

In the foregoing semiconductor device, the second semiconductor chip may include a plurality of second functional blocks each serving as a unit circuit that performs a specific function, and the plurality of second functional blocks may each electrically connected to the plurality of first functional blocks through the first communication path.

In the foregoing semiconductor device, the second semiconductor chip may include a plurality of second functional blocks, and the plurality of second functional blocks may be shared by the first functional blocks.

In the foregoing semiconductor device, the second functional block may be a memory core, and the second semiconductor chip may be a memory chip including a plurality of memory cores.

In the semiconductor device thus constructed, the processor chip including the plurality of processor cores and the memory chip including the plurality of memory cores are located so as to oppose each other through the interposer. The processor cores can communicate with the memory chip in parallel, through the communication path (first communication path) connected to each of the processor cores, which leads to an increase in communication speed. Also, the communication between the chips is made by the intermediation of the communication path (first communication path) penetrating through the interposer thicknesswise thereof. Such arrangement enables shortening the communication distance between the chips, thereby increasing the communication speed.

Thus, the present invention provides a semiconductor device including a semiconductor chip having a plurality of functional blocks, capable of increasing communication speed between each of the functional blocks and another semiconductor chip.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of the present invention will be described in details, referring to the accompanying drawings. In all the drawings, same constituents will be given the same numeral, and the description thereof will not be repeated.

First Embodiment

Figure 1A:
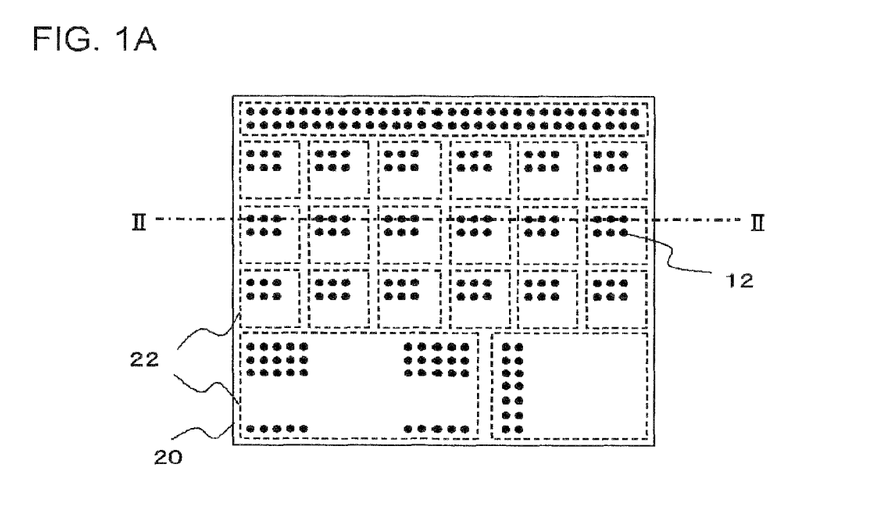
FIGS. 1A and 1B are plan views showing a semiconductor device according to a first embodiment of the present invention.
Figure 1B:
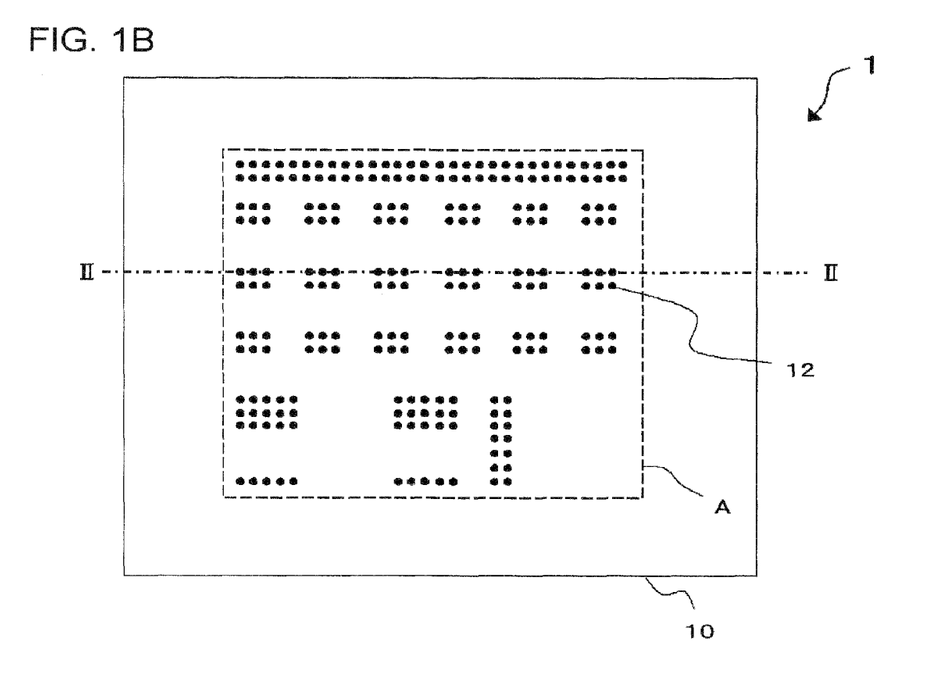
Figure 2:
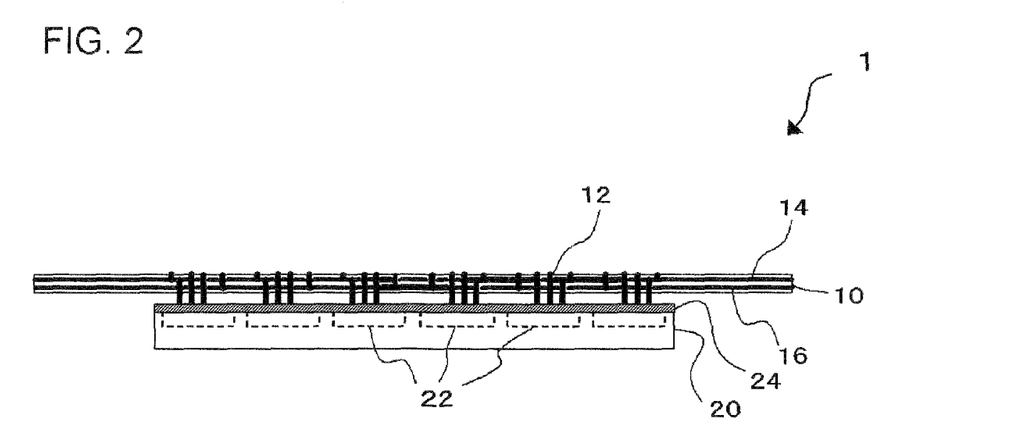
FIG. 2 is a cross-sectional view taken along a line II-II in FIGS. 1A and 1B.

FIGS. 1A and 1B are plan views showing a semiconductor device according to a first embodiment of the present invention. FIG. 1A is a plan view of a first semiconductor chip 20, and FIG. 1B a plan view of an interposer 10. FIG. 2 is a cross-sectional view taken along a line II-II in FIGS. 1A and 1B. The semiconductor device 1 includes a first semiconductor chip 20 having a plurality of first functional blocks 22, each serving as a unit circuit that performs a specific function, a plurality of first communication paths 12 respectively connected to each of the plurality of first functional blocks 22, to be used for inputting and outputting to and from each of the plurality of first functional blocks 22, and an interposer 10 that supports the first semiconductor chip 20, and the first communication paths 12 are provided so as to penetrate through the interposer in a thicknesswise direction thereof.

On a surface of the interposer 10, the first semiconductor chip 20 is mounted. The first semiconductor chip 20 is mounted on the interposer 10 by means of bumps (not shown), such that the surface with the circuits opposes the interposer 10.

As shown in FIG. 1A, the first semiconductor chip 20 includes the plurality of first functional blocks 22. The functional block herein refers to a unit circuit that performs a specific function, such as a processor core or a memory core. Also, in the case where a single semiconductor chip includes a plurality of functional blocks, each of the plurality of functional blocks may have the same function, or different functions. In this embodiment, the first functional blocks 22 are all processor cores, and the first semiconductor chip 20 is a processor chip including a plurality of processor cores, which is what is known as a multicore processor. The processor core herein refers to a circuit block capable of independently acting as a processor. The processor core herein refers to a circuit block capable of independently performing a function as a processor. To each of the first functional blocks 22, a plurality of communication paths 12 (first communication path) is respectively connected, for inputting and outputting to and from each of the first functional blocks 22. As shown in FIG. 2, the first semiconductor chip 20 includes a communication path 24 provided among the first functional blocks 22 (processor cores). The communication path 24 is constituted of an interconnect (not shown) formed on the first semiconductor chip 20.

In a region surrounded by a broken line A in FIG. 1B, the interposer 10 supports the first semiconductor chip 20. As shown in FIG. 2, the plurality of communication paths 12 is provided so as to penetrate through the interposer 10 thicknesswise thereof. To be more detailed, the interposer 10 includes through electrodes (not shown) formed thicknesswise thereof, and such through electrodes constitute the communication paths 12. The first semiconductor chip 20 also includes the communication path 24 provided among the first functional blocks 22.

The interposer 10 also includes a communication path 14 (second communication path), and a power supply path 16 (first power supply path). The communication path 14 serves as a communication path between the first semiconductor chip 20 and an external device. Here, the "external device" refers to an electronic component (not shown) mounted on the interposer 10, but other than the first semiconductor chip 20. Such electronic components include another processor chip than the first semiconductor chip 20 (processor chip). The power supply path 16 serves as a path which power is to be supplied to the first semiconductor chip 20. The communication path 14 and the power supply path 16 are constituted of an interconnect (not shown) formed on the interposer 10.

To the interposer 10, an external connection terminal may be connected, such as solder bumps electrically connected to the second communication path. Also, on the other surface of interposer 10, opposite to the surface on which the first semiconductor chip is provided, another semiconductor chip may be provided.

Preferably, the interposer 10 is constituted of an insulating material such as resin, for example a polyimide resin. The interposer 10 may also be constituted of silicon. The interposer 10 may include an active element such as a transistor, but this is not mandatory.

The processor chip (first semiconductor chip 20) may be either homogeneous or heterogeneous. In other words, the processor cores (first functional blocks 22) provided in the processor chip may be of the same type or of different types. Also, each of the processor cores may be a general-purpose processor core or a processor core for a specific use. Examples of the latter include a processor core for image processing, sound processing, and communication processing. Further, the general-purpose processor core and the processor core for a specific use may be mixedly provided in the processor chip.

The foregoing embodiment provides the following advantageous effects. The semiconductor device 1 includes the first semiconductor chip 20 having the plurality of first functional blocks 22, each serving as a unit circuit that performs a specific function, the plurality of first communication paths 12 respectively connected to each of the plurality of first functional blocks 22, to be used for inputting and outputting to and from each of the first functional blocks 22, and the interposer 10 that supports the first semiconductor chip 20, and the first communication path 12 is provided so as to penetrate through the interposer in a thicknesswise direction thereof. Such structure allows operating the plurality of first functional blocks 22 so as to perform parallel communication and retrieving an input/output signal through a shortest possible distance, thereby increasing the communication speed.

Also, the first semiconductor chip 20 includes the communication path 24 provided among the plurality of first functional blocks 22, and the interposer 10 includes the second communication path 14 serving as the communication path between the first semiconductor chip 20 and an external device, and the first power supply path 16 through which power is supplied to the first semiconductor chip 20. Accordingly, upon utilizing the first functional block as the processor core, the respective processor cores can be operated in parallel, so as to perform data communication among the processor cores.

In the foregoing embodiment, the first functional block 22 is a processor core, and the first semiconductor chip 20 is a processor chip including the plurality of processor cores. The plurality of first communication paths 12 is respectively connected to the plurality of processor cores (first functional block 22) of the processor chip (first semiconductor chip 20). Under such structure, inputting and outputting are performed to and from each of the plurality of processor cores. Such arrangement enables the processor cores to operate in parallel, as well as to perform communication in parallel, thereby increasing the communication speed. It is also possible to retrieve an input/output signal through a shortest possible distance by means of the communication path 12 penetrating through the interposer 10 thicknesswise thereof, which is another advantage contributing to increasing the communication speed.

Further, according to the foregoing embodiment, operating the plurality of processor cores in parallel results in reduced power consumption, in comparison with the case of operating a single processor at a higher frequency.

In the case where the interposer 10 is constituted of an insulating material such as resin, parasitic capacitance can be suppressed at a lower level than the case of employing silicon for the interposer 10. This is because employing the resin eliminates the need to form an insulating layer on the sidewall of the through electrode constituting the communication path 12. With such structure, the impedance of the interconnect in the interposer 10, as well as the impedance of the through electrode constituting the communication path 12, can be significantly reduced. Consequently, the communication speed through the communication path 12 can be further increased.

Second Embodiment

Figure 3:
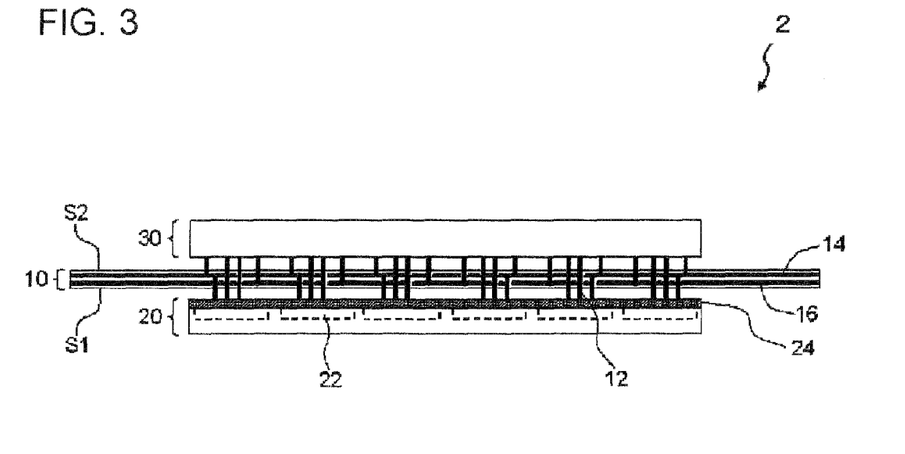
FIG. 3 is a cross-sectional view showing a semiconductor device according to a second embodiment of the present invention.

FIG. 3 is a cross-sectional view showing a semiconductor device according to a second embodiment of the present invention. The semiconductor device 2 is different from the foregoing embodiment in further including a second semiconductor chip 30 formed on a second surface of the interposer 10 opposite to the surface on which the first semiconductor chip 20 is provided. The first semiconductor chip 20 and the second semiconductor chip 30 are mutually connected through the first communication path 12.

On a surface S1 of the interposer 10, the first semiconductor chip 20 is mounted. On a surface opposite to the surface on which the first semiconductor chip 20 (second surface S2), the second semiconductor chip 30 is mounted. Accordingly, the first semiconductor chip 20 and the second semiconductor chip 30 are oriented so as to oppose each other through the interposer 10. The first semiconductor chip 20 and the second semiconductor chip 30 are face-down mounted by means of bumps (not shown). In other words, the first semiconductor chip 20 and the second semiconductor chip 30 are mounted such that the respective surface on which circuits are provided opposes the interposer 10. Here, the first semiconductor chip 20 and the second semiconductor chip 30 may be the same or different in area.

The first semiconductor chip 20 includes a plurality of first functional blocks 22, to each of which a plurality of communication paths 12 (first communication paths) is respectively connected, for inputting and outputting to and from each of the first functional blocks 22, as in the foregoing embodiment. In this embodiment, the first functional block 22 is a processor core, and the first semiconductor chip 20 is a processor chip including a plurality of processor cores. The second semiconductor chip 30 is a memory chip.

The interposer 10 includes a communication path 12 (first communication path) provided between each processor core (first functional block 22) of the processor chip (first semiconductor chip 20) and the memory chip (second semiconductor chip 30). To be more detailed, the interposer 10 includes a through electrode (not shown) formed so as to penetrate through the interposer 10 thicknesswise thereof, and such through electrode constitutes the communication path 12. Thus, the processor cores and the memory chip are electrically connected to each other through the communication path 12 penetrating through the interposer 10 thicknesswise thereof.

The interposer 10 also includes a communication path 14 (second and third communication path), and a power supply path 16 (first and second power supply path). The communication path 14 serves as a communication path between an external device and each of the first semiconductor chip 20 and the second semiconductor chip 30. Here, the "external device" refers to an electronic component (not shown) mounted on the interposer 10, but other than the first semiconductor chip 20 and the second semiconductor chip 30. Such electronic components include another processor chip than the first semiconductor chip 20 (processor chip), and another memory chip than the second semiconductor chip 30 (memory chip). The power supply path 16 serves as a path through which power is to be supplied to the first semiconductor chip 20 and the second semiconductor chip 30, respectively. The communication path 14 and the power supply path 16 are constituted of an interconnect (not shown) formed on the interposer 10.

In this embodiment, the interposer 10 extends further outward from the first semiconductor chip 20 and the second semiconductor chip 30. In other words, the interposer 10 sticks out from between the first semiconductor chip 20 and the second semiconductor chip 30. In the case where the first semiconductor chip 20 and the second semiconductor chip 30 are different in area, it is preferable that the interposer 10 extends further outward from at least one (the smaller one) of the first semiconductor chip 20 and the second semiconductor chip 30. Preferably, the interposer 10 is constituted of resin, for example a polyimide resin. The interposer 10 may also be constituted of silicon. The interposer 10 may include an active element such as a transistor, but this is not mandatory.

The first semiconductor chip 20 is what is known as a multicore processor, and includes a plurality of processor cores (first functional blocks 22). The first semiconductor chip 20 includes a communication path 24 provided among the processor cores. The communication path 24 is constituted of an interconnect (not shown) formed on the first semiconductor chip 20. The second semiconductor chip 30 is a memory chip, and includes a plurality of memory cores (second functional blocks 32). The plurality of memory cores is shared by the plurality of processor cores.

This embodiment provides the following advantages. In the semiconductor device 2, the first semiconductor chip 20 and the second semiconductor chip 30 are three-dimensionally located with the interposer 10 provided therebetween. And through the communication path 12 penetrating through the interposer 10 thicknesswise thereof, the communication between the processor cores, i.e. the first functional blocks 22 of the first semiconductor chip 20, and the memory chip is executed in parallel. Such structure achieves a significantly shorter communication distance between the processor cores (first functional blocks 22) and the memory chip (second semiconductor chip 30), as well as allows performing the communication in parallel, thereby significantly improving the communication speed. Consequently, the semiconductor device 2, which includes the multicore processor (first semiconductor chip 20), can exhibit the performance to its fullest extent.

In contrast, in the semiconductor device 100 shown in FIG. 7, the communication path 130 is provided either in the substrate or the system board of the semiconductor package, as stated above. Such structure not only imposes a limitation to the number of connecting pins between the processor chip 110 and the memory chip 120, but also prolongs the communication distance. The semiconductor device 100 incurs, therefore, not only degradation in performance because of insufficient bandwidth for data communication or delay in communication between the processor chip 110 and the memory chip 120, but also an increase in power consumption for the communication. The foregoing embodiment eliminates such drawback.

In this embodiment, the plurality of processor cores is set to work in parallel, which results in a lower power consumption when compared with the case of operating a single processor at a higher frequency. Also, the processor cores are connected to the second semiconductor chip 30 disposed so as to oppose through the interposer 10. Such configuration allows securing sufficient memory capacity and higher memory bandwidth.

In this embodiment, unlike the semiconductor chip 140 shown in FIG. 8, the processor and the chip are provided on different chips respectively. This allows upgrading the integration density in the processor core to thereby shorten the distance among the processor cores, thus minimizing the delay in communication among the processor cores and reducing the power consumption.

The communication path 12 is constituted of the through electrode penetrating through the interposer 10 thicknesswise thereof. Such structure allows connecting the first semiconductor chip 20 and the second semiconductor chip 30 through a shortest possible distance. Also, the connection density between the first semiconductor chip 20 and the second semiconductor chip 30 can be maximized.

The interposer 10 extends further outward from the first semiconductor chip 20 and the second semiconductor chip 30. Such configuration allows executing communication between an external device and each of the first semiconductor chip 20 and the second semiconductor chip 30, through the communication path 14 provided in the interposer 10. Capability of executing communication between the second semiconductor chip 30 being the memory chip, and an external device permits a direct access from the external device to the memory core of the relevant memory chip, as well as inspection of the memory region.

The interposer 10 includes the power supply path 15 through which power is to be respectively supplied to the first semiconductor chip 20 and the second semiconductor chip 30. Such configuration upgrades the efficiency in power supply to the first semiconductor chip 20 and the second semiconductor chip 30.

In the interposer 10, the width and pitch of the interconnect may be designed to be wider than in semiconductor chips such as the first semiconductor chip 20 and the second semiconductor chip 30. This leads to reduced impedance of the interconnect in the interposer 10, increased communication speed between the external device and each of the first semiconductor chip 20 and the second semiconductor chip 30, and also to reduced power consumption. In addition, power loss can be reduced when supplying power to the first semiconductor chip 20 and the second semiconductor chip 30.

In particular, in the case where the interposer 10 is constituted of an insulating material such as resin, parasitic capacitance can be more effectively suppressed than in the case where the interposer 10 is constituted of silicon. This is because employing the resin eliminates the need to form an insulating layer on the sidewall of the through electrode constituting the communication path 12. Accordingly, the impedance of the interconnect in the interposer 10, as well as the impedance of the through electrode constituting the communication path 12 can be further reduced. Consequently, the communication speed between the first semiconductor chip 20 and the second semiconductor chip 30 can be further increased.

The memory chip (second semiconductor chip 30) includes the memory cores shared by the plurality of processor cores (first functional blocks 22). Under such system, each of the processor cores utilizes a sector of the memory core that is not utilized by another processor core. Accordingly, the occupancy rate of the memory core is increased, which naturally leads to higher utilization efficiency of the memory core.

Third Embodiment

Figure 4:
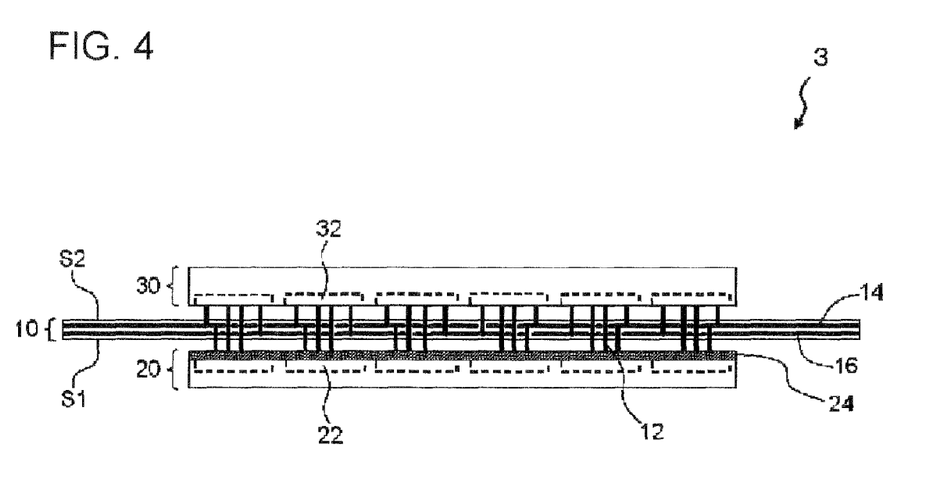
FIG. 4 is a cross-sectional view showing a semiconductor device according to a third embodiment of the present invention.

FIG. 4 is a cross-sectional view showing a semiconductor device according to a third embodiment of the present invention. The semiconductor device 3 is different from the foregoing embodiment in that the second semiconductor chip 30 includes a plurality of second functional blocks (local memories) 32. In this embodiment, the second functional block is a memory core, and the second semiconductor chip 30 is a memory chip including a plurality of memory cores. The plurality of processor cores (first functional blocks 22) is each electrically connected to one of the memory cores (second functional blocks 32) different from one another, through the communication path 12 (first communication path). To be more detailed, each of the processor cores and the opposing one of the second functional blocks 32 are electrically connected to each other, through the communication path 12.

In this embodiment, the processor cores are each allocated with an exclusive one of the memory cores. Accordingly, each processor core can always utilize the memory core allocated thereto, irrespective of the utilization status of the memory cores by other processor cores. Such arrangement eliminates the need to exchange, among the plurality of processor cores, information on the utilization status of the memory cores. Consequently, the signal processing work of the processor chip can be alleviated, and hence the communication speed between the processor chip and the memory chip can be further increased. The structure of the remaining portion of this embodiment, and the advantages thereby achieved are the same as those of the foregoing embodiment.

Fourth Embodiment

Figure 5:
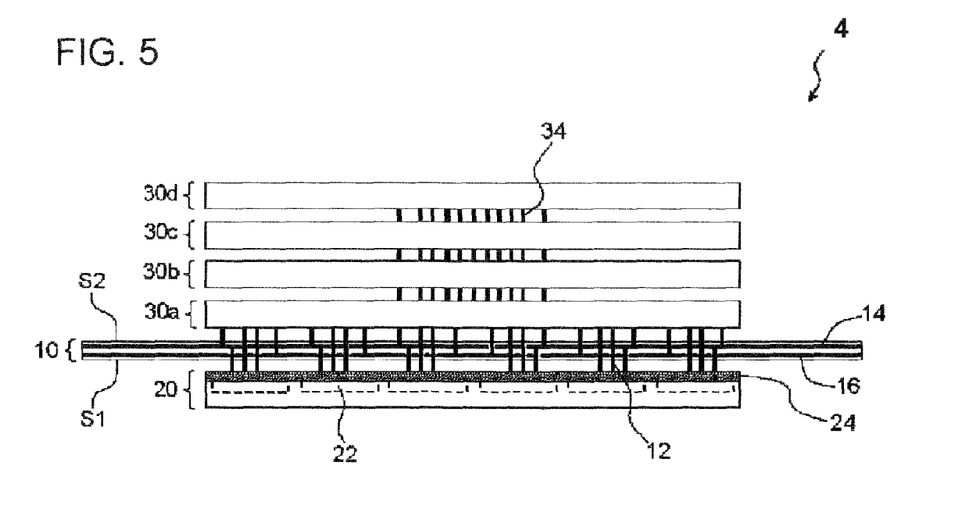
FIG. 5 is a cross-sectional view showing a semiconductor device according to a fourth embodiment of the present invention.

FIG. 5 is a cross-sectional view showing a semiconductor device according to a fourth embodiment of the present invention. The semiconductor device 4 includes a plurality of memory chips 30a, 30b, 30c, 30d stacked on one another. To be more detailed, the memory chips 30a, 30b, 30c, 30d are sequentially stacked on the surface S2 of the interposer 10. Each processor core (first functional block 22) is electrically connected to the memory chips 30a, 30b, 30c, 30d through the first communication path.

The memory chips 30a, 30b, 30c, 30d are connected to one another through a communication path 34. The memory chip 30a includes an interconnect (not shown) formed so as to penetrate through the memory chip 30a, thus to form a part of the communication path 34. This is also the case with the memory chips 30b, 30c. The memory chips 30a, 30b, 30c, 30d each include the memory cores shared by the plurality of processor cores (first functional blocks 22), as the memory chip (second semiconductor chip 30) shown in FIG. 3. The structure of this embodiment allows increasing the overall capacity of the memory connected to the processor cores. The structure of the remaining portion of this embodiment, and the advantages thereby achieved are the same as those of the foregoing embodiment.

Fifth Embodiment

Figure 6:
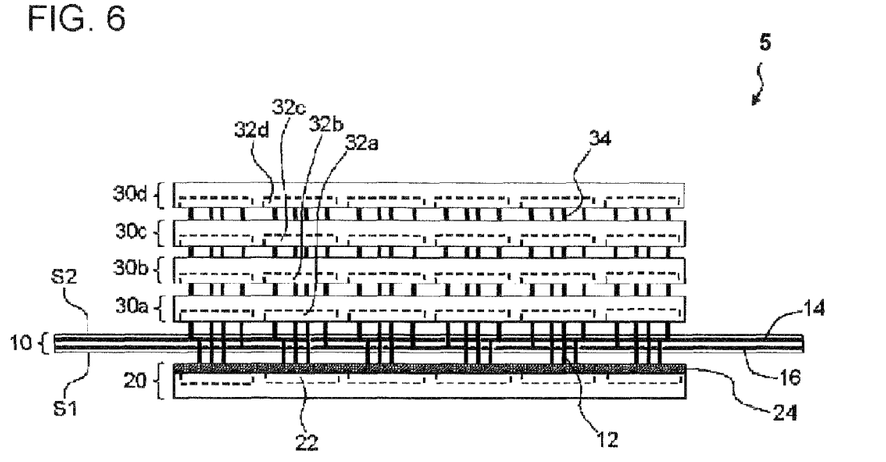
FIG. 6 is a cross-sectional view showing a semiconductor device according to a fifth embodiment of the present invention.

FIG. 6 is a cross-sectional view showing a semiconductor device according to a fifth embodiment of the present invention. In the semiconductor device 5, the plurality of memory chips 30a, 30b, 30c, 30d each include a plurality of memory cores (local memories) 32a, 32b, 32c, 32d. The plurality of processor cores (first functional blocks 22) is each electrically connected to one of the memory cores 32a different from one another. Further, the plurality of processor cores is each electrically connected to one of the memory cores 32b different from one another. This is also the case with the memory cores 32c, 32d. To be more detailed, each of the processor cores and the opposing ones of the memory cores 32a, 32b, 32c, 32d are mutually connected through the communication path 12 and the communication path 34.

In this embodiment, the processor cores (first functional blocks 22) are each allocated with exclusive ones of the memory cores (second functional blocks) 32a, 32b, 32c, 32d. Accordingly, each processor core can always utilize the memory cores 32a, 32b, 32c, 32d allocated thereto, irrespective of the utilization status of the memory cores 32a, 32b, 32c, 32d by other processor cores. Such arrangement eliminates the need to exchange, among the plurality of processor cores, information on the utilization status of the memory cores 32a, 32b, 32c, 32d. Consequently, the signal processing work of the processor chip can be alleviated, and hence the communication speed between the processor chip and the memory chips 30a, 30b, 30c, 30d can be further increased. The structure of the remaining portion of this embodiment, and the advantages thereby achieved are the same as those of the foregoing embodiment.

The present invention is not limited to the foregoing embodiments, but various modifications may be made. To cite a few examples, although the memory chips 30a, 30b, 30c, 30d shown in FIG. 6 are each face-down mounted, the memory chips 30a, 30b, 30c, 30d may be face-up mounted. In other words, referring to FIG. 4, the memory cores 32a, 32b, 32c, 32d may be located on the upper side of the memory chips 30a, 30b, 30c, 30d, respectively. Also, FIGS. 3 and 4 illustrate the structure that the plurality of memory chips 30a, 30b, 30c, 30d are stacked on one another. However, various other methods may be adopted, for example employing a three-dimensional memory chip including therein a plurality of stacked memory cores.

Although the communication path 12 is located right upon each of the first functional blocks 22 in the foregoing embodiments in FIGS. 1A to 6, the communication path 12 may be concentrated at a predetermined portion of the first semiconductor chip 20. Also, in FIGS. 3 to 6, the communication path 12 between each first functional block 22 and the second semiconductor chip 30 may be shared, in other words, a single communication path 12 may be shared by a plurality of first functional blocks 22.

It is to be noted that because of the simplified illustrations in FIGS. 3 to 6, it appears as if the communication path 14 serving as the communication path with an external device were shared by the first semiconductor chip 20 and the second semiconductor chip 30. Actually, however, the communication path (second communication path) between the first semiconductor chip 20 and an external device, and the communication path (third communication path) between the second semiconductor chip 30 and an external device are separately provided. Through the second or the third communication path, another memory chip than the second semiconductor chip 30 may be connected. Notwithstanding the above, the communication path 14 may actually be shared by the first semiconductor chip 20 and the second semiconductor chip 30.

Likewise, in FIGS. 3 to 6 it appears as if the power supply path 16 were shared by the first semiconductor chip 20 and the second semiconductor chip 30. Actually, however, the path for supplying power to the first semiconductor chip 20 and the path for supplying power to the second semiconductor chip 30 are separately provided. Notwithstanding the above, the power supply path 16 may actually be shared by the first semiconductor chip 20 and the second semiconductor chip 30.

It is apparent that the present invention is not limited to the above embodiment, and may be modified and changed without departing from the scope and spirit of the invention.

What is claimed is:

1. A semiconductor device comprising:
   a first semiconductor chip including a plurality of first functional blocks each serving as a unit circuit that performs a specific function;
   a plurality of first communication paths respectively connected to each of said plurality of first functional blocks, to be used for inputting and outputting to and from each of said plurality of first functional blocks; and
   an interposer that supports said first semiconductor chip,
   wherein said first communication paths are provided so as to penetrate through said interposer in a thicknesswise direction thereof.

2. The semiconductor device according to claim 1,
wherein said first semiconductor chip includes a communication path provided among said plurality of first functional blocks 3. The semiconductor device according to claim 1,
wherein said interposer further includes a second communication path serving as a communication path between said first semiconductor chip and an external device.

4. The semiconductor device according to claim 1,
wherein said interposer further includes a first power supply path through which power is to be supplied to said first semiconductor chip.

5. The semiconductor device according to claim 1,
wherein said first functional block is a processor core; and
said first semiconductor chip is a processor chip including a plurality of processor cores.

6. The semiconductor device according to claim 1, further including a second semiconductor chip,
wherein said second semiconductor chip is provided on a second surface opposite to a first surface on which said first semiconductor chip is provided; and
said first and said second semiconductor chip are mutually connected through said first communication path.

7. The semiconductor device according to claim 6,
wherein said second semiconductor chip includes a plurality of second functional blocks each serving as a unit circuit that performs a specific function; and
each of said second functional blocks is electrically connected to one of said plurality of first functional blocks different from one another, through said first communication path.

8. The semiconductor device according to claim 7,
wherein said second functional block is a memory core; and
said second semiconductor chip is a memory chip including a plurality of memory cores.

9. The semiconductor device according to claim 8,
wherein said second semiconductor chip includes a plurality of memory chips stacked on one another.

10. The semiconductor device according to claim 6,
wherein said second semiconductor chip includes a plurality of second functional blocks; and
said plurality of second functional blocks is shared by said first functional blocks.

11. The semiconductor device according to claim 10,
wherein said second functional block is a memory core; and
said second semiconductor chip is a memory chip including a plurality of memory cores.

12. The semiconductor device according to claim 11,
wherein said second semiconductor chip includes a plurality of memory chips stacked on one another.

13. The semiconductor device according to claim 6,
wherein said interposer further includes a third communication path serving as a communication path between said second semiconductor chip and an external device.

14. The semiconductor device according to claim 6,
wherein said interposer extends further outward from at least one of said first and second semiconductor chips.

15. The semiconductor device according to claim 6,
wherein said interposer further includes a second power supply path through which power is to be supplied to said second semiconductor chip.

16. The semiconductor device according to claim 1,
wherein said interposer is constituted essentially of an insulating material.

17. The semiconductor device according to claim 1,
wherein said interposer is free from including an active element.

* * * * *